United States Patent [19]

van den Berg et al.

[11] Patent Number: 4,776,863
[45] Date of Patent: Oct. 11, 1988

[54] CUTTING TOOL

[75] Inventors: Hendrikus van den Berg; Udo König, both of Essen; Norbert Reiter, Mettmann, all of Fed. Rep. of Germany

[73] Assignee: Fried. Krupp Gesellschaft mit beschränkter Haftung, Essen, Fed. Rep. of Germany

[21] Appl. No.: 71,656

[22] Filed: Jul. 9, 1987

Related U.S. Application Data

[63] Continuation-in-part of Ser. No. 64,428, Jun. 22, 1987, abandoned.

[30] Foreign Application Priority Data

Jun. 21, 1986 [DE] Fed. Rep. of Germany ....... 3620901

[51] Int. Cl.$^4$ .............................................. G24G 1/00
[52] U.S. Cl. ........................................ 51/295; 51/297; 51/307; 428/627; 428/698; 428/908.8
[58] Field of Search ............... 428/698, 908.8, 627; 51/307, 297, 295

[56] References Cited

U.S. PATENT DOCUMENTS

| | | | |
|---|---|---|---|
| 4,406,667 | 9/1983 | Sarin et al. | 428/698 |
| 4,406,668 | 9/1983 | Sarin et al. | 428/698 |
| 4,406,670 | 9/1983 | Sarin et al. | 428/698 |

OTHER PUBLICATIONS

"Multiple Coated Super Hard Alloy and its Production," Chemical Abstracts, JP-53-1112, vol. 2, No. 46, of Mar. 28th, 1978.

"Double-Coated Super Hard Alloy Part and Production Thereof," Chemical Abstracts, JP-53-3906, vol. 2, No. 46, of Mar. 28th, 1978.

"Zeitschrift *Metall*", vol. 26, pp. 182-132, (1972) Professor R. Kieffer.

*Primary Examiner*—Stephen J. Lechert, Jr.
*Attorney, Agent, or Firm*—Spencer & Frank

[57] ABSTRACT

A cutting tool, in particular of hard metal, which is coated with hard layers of titanium carbide, titanium carbonitride and/or titanium nitride and that has an outer thin layer of zirconium nitride. The thickness of this outer layer of zirconium nitride amounts to between 1 and 30%, preferably 1 to 10%, of the thickness of the base coating of titanium carbide, titanium carbonitride and/or titanium nitride.

12 Claims, 2 Drawing Sheets

CUTTING TOOL

CROSS-REFERENCE TO RELATED APPLICATION

This application is a co-pending continuation-in-part of application Ser. No. 07/064,428, filed June 22, 1987, now abandoned.

BACKGROUND OF THE INVENTION

The invention relates to a cutting tool the edge of which is coated with layers of titanium carbide, titanium carbonitride and/or titanium nitride.

It is known that cutting tools, in particular those of hard metal, can be provided with coatings of titanium carbide, titanium carbonitride and/or titanium nitride and the wear-resistance of these tools can thereby be improved considerably. The use of binder-metal-free hard substance coatings of nitrides and carbonitrides of elements of columns IVa to VIa of the periodic table for abrasion protection of tools of hard metals is described, for example in FRG Patent No. 1 959 690, and among the aforementioned group of hard materials, hard materials based on the element titanium have proved themselves particularly well in practice.

A further increase in the life of cutting tools made of hard metals can be attained in accordance with the proposal in FRG Patent No. 2 263 210 by providing a multi-layer coating of titanium carbide, titanium carbonitride and titanium nitride. Indexable inserts of hard metals having a coating composed of several layers of titanium carbide, titanium carbonitride and titanium nitride are particularly well suited to machining of steels at medium cutting speeds.

Higher cutting speeds, however, generate high temperatures at the noses of the cutting tools, resulting in a rapidly progressing diffusion and oxidation wear. Accordingly, it has already been proposed for this application to increase the service life of such cutting tools by applying thin layers of aluminum oxide to them. In the present state of the art, for medium cutting speeds and large chip cross sections, cutting inserts coated with titanium carbide, titanium carbonitride and titanium nitride have become established; for high cutting speeds, coatings of oxides of aluminum or zirconium, often also in combination with a coating with the nitrides and carbides of titanium, are preferably used.

SUMMARY OF THE INVENTION

An object of the present invention is to provide cutting tools having a still longer service life. This object is attained by applying a first coating of titanium carbide, titanium carbonitride and/or titanium nitride first to a cutting tool, in particular to an indexable insert of hard metal, and on the first coating depositing a further outer layer, which is thin in comparison with the first coating, of zirconium nitride. Even if the thickness of the zirconium nitride layer is only approximately one-tenth of the total thickness of the coatings on the tool, cutting tools according to the invention then have a considerably longer service life at medium to high cutting speeds. This is unexpected, because those skilled in the art have always been of the opinion that zirconium nitride cannot bring about a substantial reduction in wear.

DESCRIPTION OF THE PREFERRED EMBODIMENTS

Figure 1:
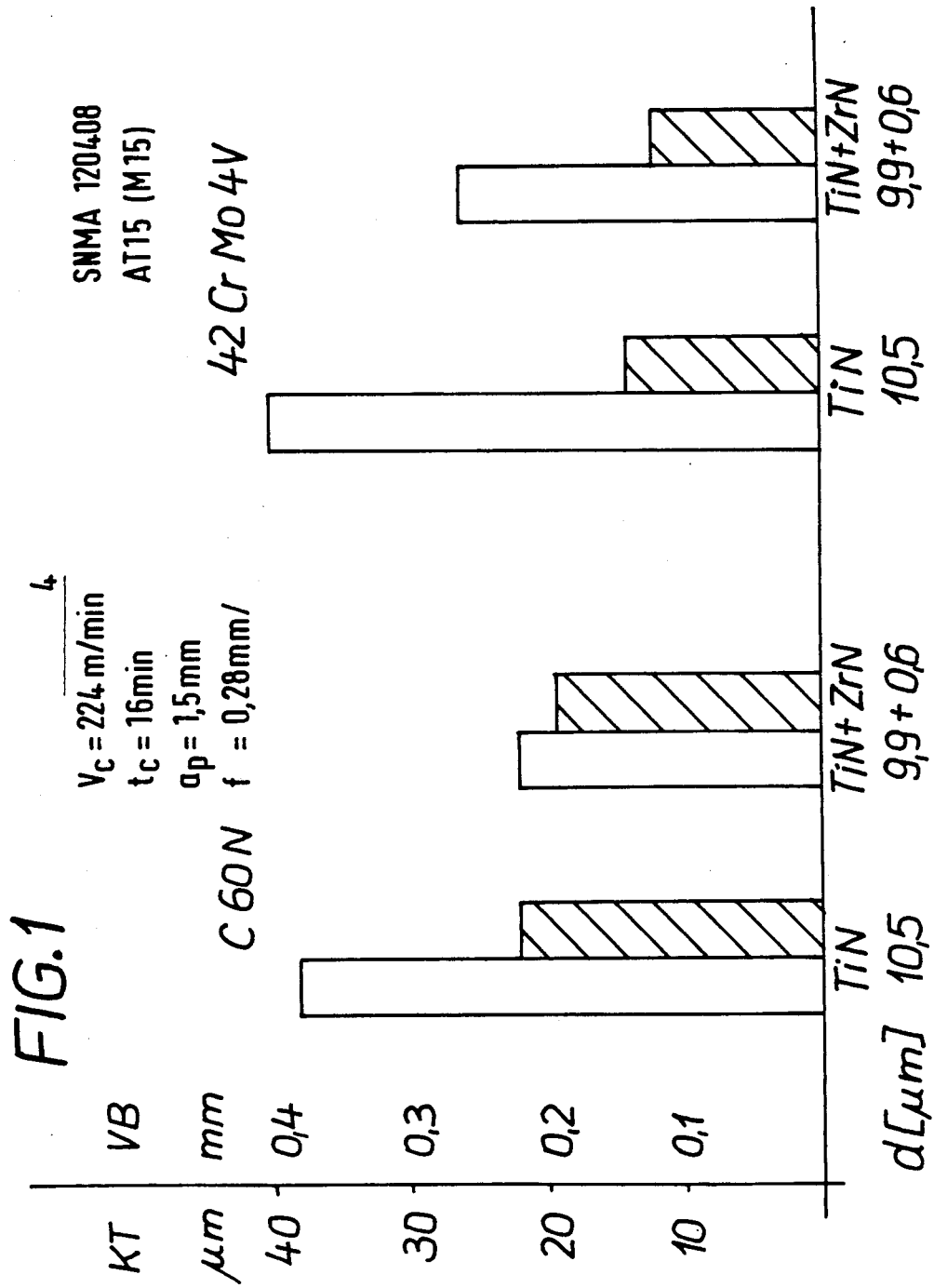
FIG. 1 is a bar graph illustrating the durability of cutting edges coated according to the present invention.

The invention will be explained in further detail below, referring to exemplary embodiments.

An indexable insert of hard metal having the composition 82.5% W, 11% (Ti, Ta, Nb)C and 6.5% Co (these percentages being by weight) were coated in a suitable apparatus with two successive layers of titanium carbonitride, using the method of chemical vapor deposition (CVD method). The gas mixtures of titanium tetrachloride, hydrogen, methane and nitrogen required for the deposition were selected such that the inner layer of titanium carbonitride had a higher carbon concentration than the outer layer.

The heat-resistant steel reaction vessel of the CVD apparatus used had a volume of approximately 30 l and was heated, by means of an electric furnace slipped over it like a hood, to a temperature of 1000° C. To perform these chemical vapor depositions, respective gas mixtures which contain the gases listed in the following table are introduced successively into the reaction vessel. Also listed in this table are the gas quantities, pressures and temperatures selected.

TABLE 1

|  | First layer Gas quantity (liters hour) | Second layer Gas quantity (liters hour) |
|---|---|---|
| TiCl$_4$ | 5 | 10 |
| H$_2$ | 350 | 530 |
| CH$_4$ | 60 | 60 |
| N$_2$ | 130 | 238 |
| Temperature | 990° C. | 990° C. |
| Pressure | 500 hPa* | 700 hPa |
| Time | 120 minutes | 180 minutes |

*hPa = hecto Pascals = Pa × 10$^2$

To accelerate the deposition and attain fine particle size in the coating structure, a catalytically active aluminum halide additive is introduced into the gas atmosphere.

In the present case an amount of 5 liters per hour of aluminium cloride AlCl$_3$ were fed into the gas mixture during the whole coating time.

After a period of a total of 300 minutes, the supply of titanium tetrachloride and methane is shut off. For depositing a coating of zirconium nitride, a gas mixture of 370 l/h of hydrogen, 330 l/h of nitrogen and 5 l/h of zirconium tetrachloride is then introduced into the reaction vessel, the temperature being raised during this process step to 1010° C. The pressure in the interior of the vessel was 700 hPa.

At the end of 60 minutes, the supply of all gases except for the hydrogen was shut off, and the reaction vessel was cooled. After elimination of the hydrogen gas, the vessel was vented and opened, and the hard metal bodies, now coated, were removed. The total thickness of the two layers of titanium carbonitride was between 9 and 12μ, depending on the location of the samples in the reaction vessel, while the outer zirconium nitride layer, which because of its characteristic yellow color can easily be distinguished from the titanium carbonitride, had a thickness of approximately 0.7 to 1μ.

For testing the wear resistance of the indexable inserts coated in accordance with the invention, their service life was determined by chip removal of the steel materials C60N and 42CrMo4V by lathe machining with smooth cutting at various cutting speeds. The lathe test was interrupted at certain time intervals and the increase in wear of the nose of the tool was determined by measurement of the crater depth KT and the wear mark width VB. The cutting time until attainment of a crater depth of KT=60μ or a wear mark width of VB=0.2 mm was set as the criterion for the end of the service life of the indexable inserts. The cutting depth $a_p$=1.5 mm and the feed f=0.28 mm per revolution as well as the other geometrical settings were maintained constant during the experiments.

For comparison and for evaluation of these experiments, indexable inserts available on the market, having the same flat shape and made of the same hard metal alloy, which were coated by known manufacturing processes and did not have the covering layer of zirconium nitride according to the invention, were also tested. For machining of the material C60N, two variants were selected: as a coating A, a layer of titanium carbide, a layer of titanium carbonitride with an increasing nitrogen content toward the outside, and a layer of titanium nitride, the coating having a total thickness of 10μ, and as a coating B, a layer of titanium carbide, a layer of titanium carbonitride, four ceramic layers, each approximately 2μ thick, of aluminum oxide nitride, and thin intermediate layers of titanium nitride enclosing the ceramic layers. The total thickness of this many-layer coating was 11μ. Indexable inserts having the coating A proved satisfactory at medium cutting speeds and with large chip cross sections, while those having the coating B proved to have excellent service life at high cutting speeds.

The outcome of testing of the edge-holding property is shown in Table 2 below.

TABLE 2

Service life of coated indexable inserts in the turning of C60N steel.

| Substrate hard metal: | M 15 |
| Cutting insert type: | SNMA 120408 |
| Cutting depth: | 1.5 mm |
| Feed: | 0.28 mm per revolution |

| Coating | Layer thickness (μ) | Cutting speed (m/min) | Service Life (min) |
|---|---|---|---|
| A | 10.8 | 180 | 30 |
|  |  | 224 | 14 |
| B | 11.2 | 180 | 36 |
|  |  | 224 | 18 |
| C (in accordance with invention) | 9.2 | 180 | 62 |
|  |  | 224 | 22 |

At a cutting speed of 180 m/min, the service life of the two coatings A and B according to the prior art are far exceeded by the service life of coating C according to the invention. At the higher cutting speed of 224 m/min, the service life is lower, as a consequence of the higher cutting temperature, but in this case as well the cutting insert coated in accordance with the invention attained the longest service life of the cutting inserts tested. In the machining of the steel alloy 42CrMo4V, the results summarized in Table 3 below were obtained.

TABLE 3

Service life of coated indexable inserts in lathing of the steel alloy 42CrMo4V.

| Substrate hard metal: | M 15 |
| Cutting insert type: | SNMA 120408 |
| Cutting depth: | 1.5 mm |
| Feed: | 0.28 mm per revolution |

| Coating | Layer thickness (μ) | Cutting speed (m/min) | Service Life (min) |
|---|---|---|---|
| B | 10.6 | 224 | 18 |
|  |  | 250 | 13 |
| C (in accordance with invention) | 9.0 | 224 | 32 |
|  |  | 250 | 17 |

In order to enable better recognition of the effect of the thin outer layer of zirconium nitride, individual layers of titanium nitride approximately 10μ thick have been deposited in the above-described manner in two additional coating cycles; in one case, application of the thin covering layer of the zirconium nitride was omitted. From among the coated indexable inserts of the two experiments, pairs were selected that each had exactly the same total layer thickness, and then with these inserts comparison tests of their edge-holding property were again performed, the test parameters and results of which are shown in the Figure.

The tests depicted in the Figure were all carried with inserts having M15 substrate hard metal and of insert type SNMA 120408. Cutting speed was 224 meters/minute, the cutting depth was 1.5 mm and the feed was 0.28 mm/revolution. The machining time in each case was 16 minutes. The height of each white bar represents the resulting crater depth, KT, in μ, and the height of each cross-hatched bar represents resulting wear mark width, VB, in mn. Below each pair of related bars, the initial layer thicknesses are indicated.

It is apparent from the Figure that cutting elements having a cover layer according to the invention have crater depths KT after a machining time of 16 minutes that are from 30 to 40% less than with the equally thick titanium nitride layer without a cover layer of zirconium nitride. This advantage is exihibited both in chip removal of the C60N steel and in chip removal of the steel alloy 42CrMo4V.

Finally, tests were also performed with a thicker cover layer, approximately 2 to 3μ thick, of zirconium nitride on titanium carbonitride coatings that were 9μ thick. Once again, improvements in the edge-holding property were demonstrated, which however did not substantially exceed in extent the effects of a thin cover layer. Accordingly, it is not so much the thickness of the outer layer of zirconium nitride that is primarily important, but rather that this layer should completely cover the base coating.

It was observed, that a measurerable improvement in the wear resistance could be achieved with a zirconium nitride layer of a thickness as low as 0.1μ on top of a titanium carbo-nitride coating of 12μ in thickness.

Additional tests also confirmed the assumption that it was not the use of a coating of zirconium nitride alone that created the success sought by the invention, but rather the combination of a relatively thick total coating including other hard materials such as titanium carbide, titanium carbonitride and/or titanium nitride with a the thin outer cover coating of zirconium nitride.

In addition to the CVD method, the so-called PVD method is also suitable for deposition of the zirconium nitride cover layer.

Figure 2:
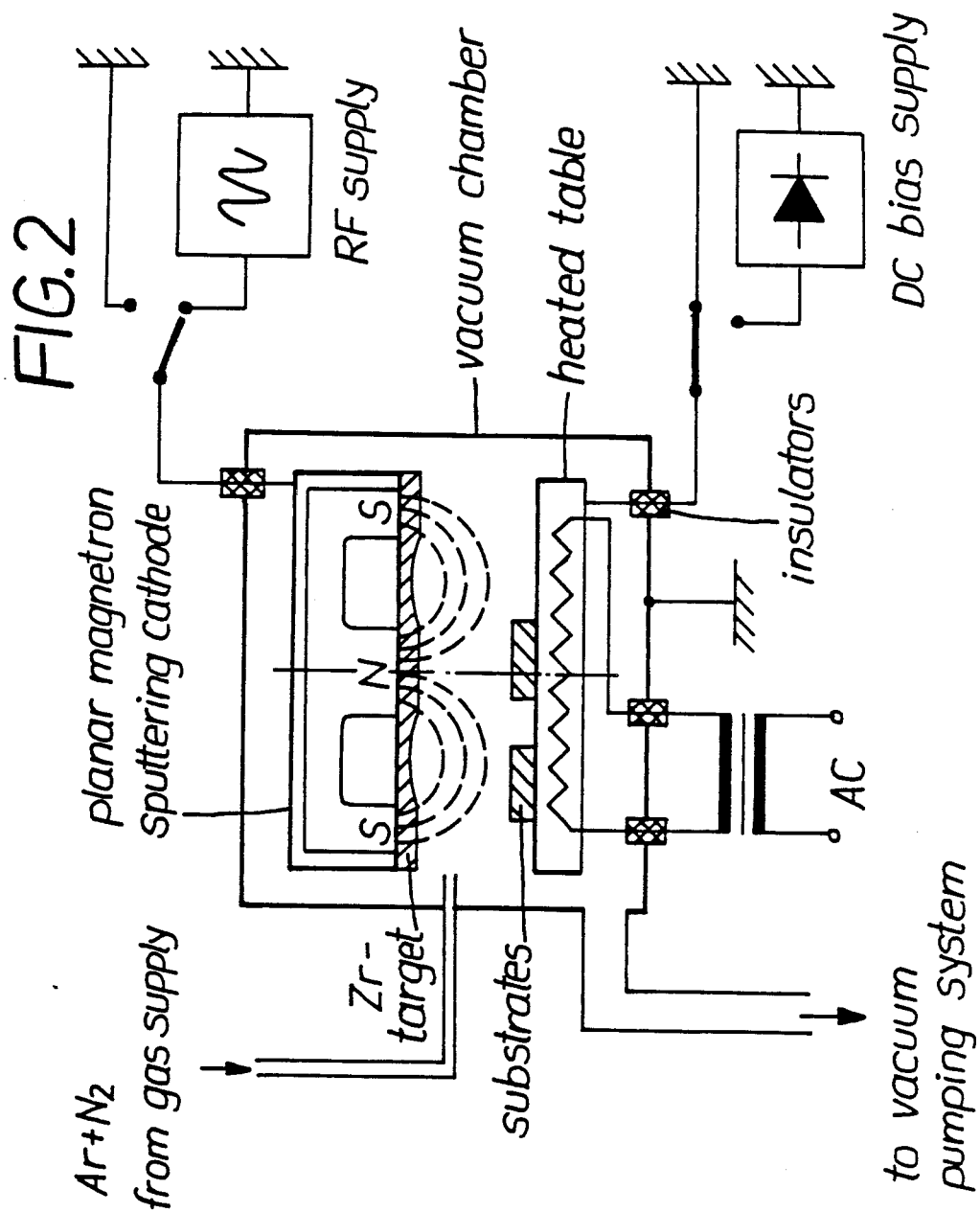
FIG. 2 is a schematic illustration of a sputtering unit used for the deposition of a zirconium nitride layer on a substrate of cemented carbides.

Physical vapour deposition (PVD) can be performed either by evaporation, by sputtering or by arc evaporation. For the present work a sputtering unit was used for the deposition of a zirconium nitride layer on substrates of cemented carbides, which were already coated by CVD with titanium nitride layers of about 10μ thickness, as described above. As shown in FIG. 2 the sputtering unit consisted of a vacuum chamber with a planar magnetron sputtering cathode, a heatable table holding the substrates, voltage supplies, a gas mixture supply and a vacuum pumping system.

The target of the sputter cathode was made of metallic zirconium. After pumping down to a residual pressure of $10^{-3}$ Pascal the vacuum chamber were filled with a gas mixture of 90 volume-% argon and 10 volume-% nitrogen having a pressure of 2 Pascal. The reactive sputtering process was driven by a RF-voltage of 2000 Volts at the frequency of 13.6 MHz. The temperature of the substrates were kept on a temperature of 450° C. After a deposition time off 60 minutes a zirconium nitride layer of 0.8μ in thickness were deposited on the side of the substrate facing the target. In a subsequent cutting test the results listed in Table 4 were achieved. Again, as in the case with CVD-coated zirconium nitride layers, the inserts with the upper PVD-coated zirconium nitride layer show an improved cutting performance.

TABLE 4

Crater wear KT and flank wear VB of coated indexable inserts in the turning of C60N steel.

| Substrate hard metal: | M 15 |
| cutting insert type: | SNMA 120408 |
| Depth off cut: | 1.5 mm |
| Feed: | 0.28 mm per revolution |
| cutting speed: | 224 meters/minute |
| cutting time: | 16 minutes |

| Coating (method) | layer thickness (μ) | KT (μ) | VB (mm) |
|---|---|---|---|
| TiN (CVD) | 10.5 | 38 | 0.22 |
| TiN (CVD) + ZrN (PVD) | 9.3 + 0.8 | 26 | 0.20 |

The invention now being fully described, it will be apparent to one of ordinary skill in the art that many changes and modifications can be made thereto without departing from the spirit or scope of the invention as set forth herein.

The present disclosure relates to the subject matter disclosed in German Application P 36 20 901.5 of June 21st, 1986, the entire specification of which is incorporated herein by reference.

What is claimed is:

1. In a cutting tool, comprising a base body having an edge on which is disposed a base coating composed of at least one of titanium carbide, titanium carbonitride and titanium nitride, the improvement comprising an outer cover layer of zirconium on said coating, the thickness of said out cover layer amounting to from 1 to 10% of the thickness of said base coating.

2. A cutting tool as defined in claim 1 wherein said base body is composed of a hard metal that substantially contains tungsten carbide and an auxiliary metal of the iron group.

3. A cutting tool as defined in claim 2 wherein the outer zirconium nitride layer is applied by the chemical vapor deposition method.

4. A cutting tool as defined in claim 2 wherein the outer zirconium nitride layer is applied by the physical vapor deposition method.

5. A cutting tool as defined in claim 1 wherein the outer zirconium nitride layer is applied by the chemical vapor deposition method.

6. A cutting tool as defined in claim 1 wherein the outer zirconium nitride layer is applied by the physical vapor deposition method.

7. A cutting tool as defined in claim 1 wherein said base body is composed of a hard metal that substantially contains tungsten carbide and an auxiliary metal of the iron group.

8. A cutting tool as defined in claim 1 wherein the outer zirconium nitride layer is applied by the chemical vapor deposition method.

9. A cutting tool as defined in claim 1 wherein the outer zirconium nitride layer is applied by the physical vapor deposition method.

10. A cutting tool as defined in claim 1 wherein said base body is composed of a hard metal that substantially contains tungsten carbide and an auxiliary metal of the iron group.

11. A cutting tool as defined in claim 1 wherein the outer zirconium nitride layer is applied by the chemical vapor deposition method.

12. A cutting tool as defined in claim 1 wherein the outer zirconium nitride layer is applied by the physical vapor deposition method.

* * * * *